(12) United States Patent
Wilson et al.

(10) Patent No.: US 8,810,263 B1
(45) Date of Patent: Aug. 19, 2014

(54) ADAPTIVE RESOLUTION CIRCUIT

(71) Applicant: Cypress Semiconductor Corporation, San Jose, CA (US)

(72) Inventors: Cole Wilson, Everett, WA (US); Jon Peterson, Everett, WA (US); Benjamin Avery, Bellingham, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/023,083

(22) Filed: Sep. 10, 2013

Related U.S. Application Data

(60) Provisional application No. 61/777,633, filed on Mar. 12, 2013.

(51) Int. Cl.
*G01R 27/26* (2006.01)
*G06F 3/044* (2006.01)

(52) U.S. Cl.
CPC ............ *G01R 27/2605* (2013.01); *G01R 27/26* (2013.01); *G06F 3/044* (2013.01)
USPC ............................ 324/686; 324/658; 345/174

(58) Field of Classification Search
CPC ...... G01R 27/2605; G01R 27/26; G01R 5/24; H03K 2217/960725
USPC .................................. 324/686, 658; 345/174
See application file for complete search history.

(56) References Cited

U.S. PATENT DOCUMENTS

| | | | |
|---|---|---|---|
| 8,092,914 B2 | 1/2012 | Omachi et al. | |
| 8,232,972 B2 | 7/2012 | Huang et al. | |
| 8,487,639 B1 | 7/2013 | Walsh et al. | |
| 2007/0074913 A1 | 4/2007 | Geaghan et al. | |
| 2008/0191713 A1* | 8/2008 | Hauer et al. | 324/658 |
| 2010/0013502 A1* | 1/2010 | Kuang | 324/686 |
| 2011/0025629 A1 | 2/2011 | Grivna et al. | |
| 2011/0163768 A1 | 7/2011 | Kwon et al. | |
| 2011/0273400 A1 | 11/2011 | Kwon et al. | |
| 2012/0043973 A1 | 2/2012 | Kremin | |
| 2012/0182028 A1* | 7/2012 | Oya | 324/684 |
| 2012/0256869 A1 | 10/2012 | Walsh et al. | |

OTHER PUBLICATIONS

Atmel, "Button, Slider, & Wheel Solutions: where there's a button, there's an opportunity" 2010, 61 pages.
Bengler, Benedikt, "Diploma Thesis: user-oriented development of an universal hardware controller for graphical user interfaces of audio software" Institute of Electronic Music and Acoustics. Feb. 2011, 71 pages.
Search Report for "Dynamic Capacitate Resolution Circuit" Aug. 2013, 7 pages.

* cited by examiner

*Primary Examiner* — Amy He
(74) *Attorney, Agent, or Firm* — Lowenstein Sandler LLP

(57) ABSTRACT

Apparatuses and methods of adaptive resolution circuits are described. One apparatus includes an input node coupled to a capacitance sense pin coupled to an electrode of a sense array and a capacitance-sensing circuit coupled to the input node and comprising an integrator configured to measure a capacitance with a first resolution. An adaptive resolution circuit is coupled to the capacitance-sensing circuit and the input node and is configured to selectively modify an integration capacitance of the integrator to set the integrator to measure the capacitance with a second resolution.

7 Claims, 10 Drawing Sheets ized impedance converter circuit according to one embodiment.
ADAPTIVE RESOLUTION CIRCUIT

RELATED APPLICATIONS

This application claims the benefit of U.S. Provisional Application No. 61/777,633, filed Mar. 12, 2013, the entire contents of which are incorporated by reference herein.

TECHNICAL FIELD

The present disclosure relates generally to sensing systems, and more particularly to capacitance-sensing systems configurable to determine touch locations of touches on the capacitive-sensing systems.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and Cypress' touch solutions sense both capacitances either uniquely or in hybrid form with its various sense modes.

BRIEF DESCRIPTION OF THE DRAWINGS

The present invention is illustrated by way of example, and not of limitation, in the figures of the accompanying drawings.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Apparatuses and methods of adaptive resolution circuits are described. One apparatus includes an input node coupled to a capacitance sense pin coupled to an electrode of a sense array and a capacitance-sensing circuit coupled to the input node and including an integrator configured to measure a capacitance with a first resolution. An adaptive resolution circuit is coupled to the capacitance-sensing circuit and the input node and is configured to selectively modify an integration parameter to set the integrator to measure the capacitance with a second resolution.

In one embodiment, the integration parameter is an integration capacitance of the integrator. In another embodiment, the integration parameter is an input resistance of the integrator. Alternatively, the integration parameter may be other programmable parameters of the integrator or the analog-to-digital converter. It should be noted that the term capacitor, as used herein, may refer to any combination of conductors and dielectrics that produce a capacitance between the conductors, as well as discrete components. For example, as described herein, a capacitance can created as an intersection between two electrodes. An intersection between the first electrode and second electrode is also called a sensor. An intersection between two sense elements (electrodes) may be understood as a location at which one sense electrode crosses over or overlaps another, while maintaining galvanic isolation from each other. In other cases, a discrete capacitor may be used to produce a capacitance.

Figure 1:
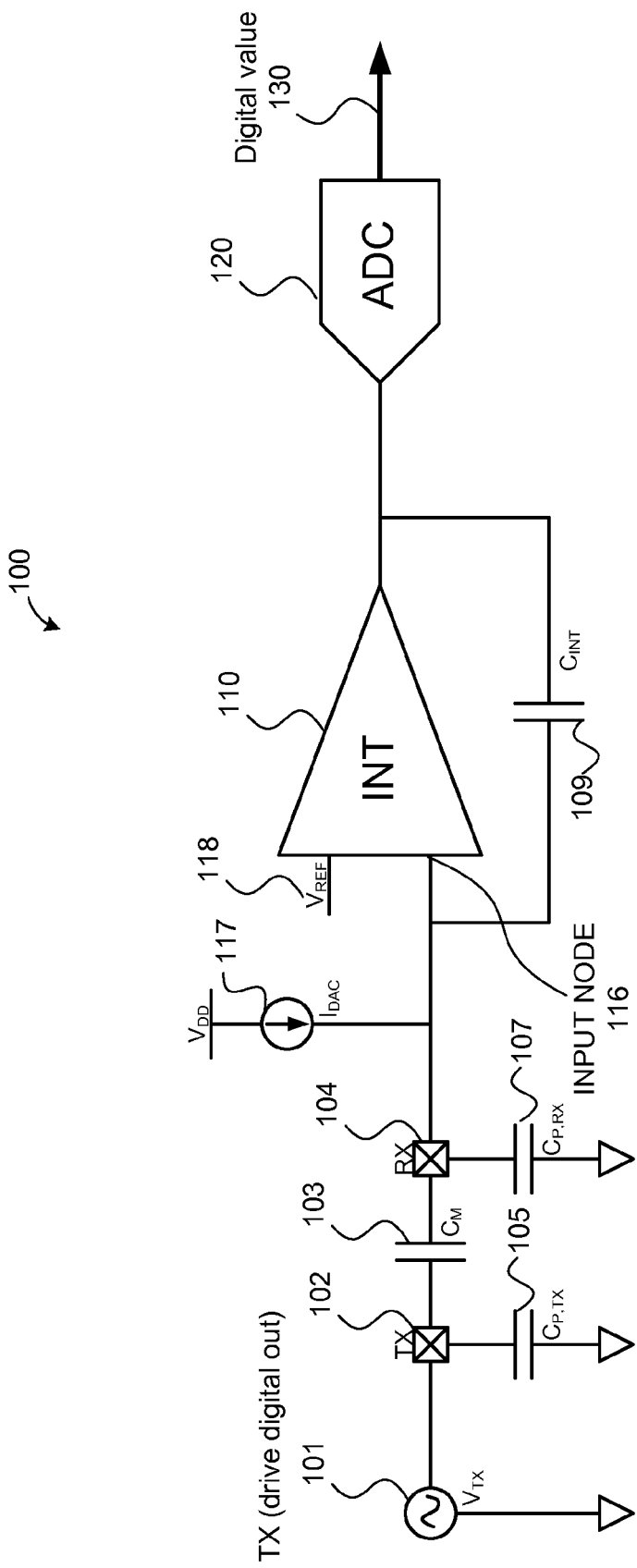
FIG. 1 is a circuit diagram illustrating a capacitance-sensing circuit according to one implementation.

FIG. 1 is a circuit diagram illustrating a capacitance-sensing circuit 100 according to one implementation. The capacitance-sensing circuit 100 typically includes an integrator 110 including an integrator capacitor 109 ($C_{INT}$). This is because of the simple relationship that CV=Q. That is, the capacitance that is being measured is related to a voltage and measured charge of the system. However, it is typically easier for circuits to transfer current. Given the relationship between current and capacitance and change of voltage, as expressed in this equation I=C dV/dt, by integrating the current, the circuit can compute CV=Q. In one implementation, a transmit (TX) signal generator 101 generates a TX signal and applies the voltage on a TX electrode 102 (TX pin), and the integrator 110 measures the injected current through a RX electrode 104 (RX pin). The TX electrode 102 has a parasitic capacitance 105 ($C_{PTX}$) (a capacitance to ground) and the RX electrode 104 has a parasitic capacitance 107 ($C_{PRX}$). This current at an input node 116 is integrated by the integrator 110, and the corresponding voltage that is measured provides insight into the change in capacitance 103 ($C_M$). The other input of integrator 110 is a voltage reference 118 (Vref). The capacitance 103 is a mutual capacitance between the TX electrode 102 and RX electrode 104. The capacitance-sensing circuit 100 can be calibrated with a programmable current source 117 (IDAC) so that the voltage that is measured for no inputs is a known value. This known value is typically set to be at a mid-scale of an analog-to-digital converter (ADC) 120. When the ADC 120 measures anything other than mid-scale, then this new voltage is a result in a change in capacitance 103, resulting from a touch on or near an intersection between the TX electrode 102 and the RX electrode 104. The input current of the integrator 110 is balanced with the current source 117, and the remaining current is integrated on the integrator capacitor 109 ($C_{INT}$) for a fixed period of time. The ADC 120 measures the voltage on the output of the integrator 110 and converts the voltage to a digital value 130. The digital value 130 represents the capacitance sense result. It should be noted that the TX electrode 102 and RX electrode 104 represent one intersection of a touch surface, such as a touch surface of a touchscreen, touchpad, a panel, or the like.

A resolution of capacitance-sensing circuit 100 is fixed. The actual resolution is related to the reference of the ADC 120, the size of integrator capacitor 109 ($C_{INT}$), and the granularity of the programmable current source 117 (IDAC). Some or all of these parameters can be changed in firmware today, but once they are chosen, they are essentially fixed. The parameters are typically tuned for the type of touch object that is expected. This is usually a finger. However, the signal level for a passive stylus is much smaller than a typical finger signal. So, when a passive stylus is put on a touch surface, the change in voltage is not really noticed by the circuit 100. Additionally, when there is noise on the panel, the capacitance-sensing circuit 100 can become saturated for a given range. To properly measure the passive stylus, the capacitance-to-digital conversion (CDC) range by the capacitance-sensing circuit 100 must be turned down to a smaller resolution. However, if the resolution is changed for the passive stylus, than a normal touch saturates the input and the maximum voltage will always be read out. Conventionally, these two touch types cannot currently exist with the same circuit using the same integration time.

Conventional methods used to sense both input types use one of two approaches. The first approach creates a new scanning mechanism that the firmware must use for passive stylus. One such mechanism is called a balanced scan, in which all TX electrodes are driven at once. The effect of doing this is that the signal from a passive stylus is greatly enhanced. However, the sensitivity is so high that a normal touch once again will drown out the stylus. Therefore, Balanced Scan does not work with touches on the touch surface at the same time as a stylus. The other cost is a second scanning method, which consumes system resources like time and memory.

The second approach scans the same intersection for longer if a stylus is expected to be present. The sensitivity can be increased by simply scanning longer, i.e., integrating over a longer period. However, there are two inherent problems with this approach. Firstly, the payoff is not good. Assuming white noise (best case), then it would take four times (4×) the scan time to get a two times (2×) signal-to-noise (SNR) gain. Therefore, the time penalty for this approach is very high. Secondly, the firmware must know when to pay this penalty. If normal mutual capacitance scanning cannot detect a stylus in the first place, then the firmware can never move to a longer integration time. In effect, more resolution is achieved through a longer integration time, limited by a natural quantization of the system. These types of circuits take longer to scan and are not as accurate as the embodiments describe herein.

The embodiments described below are directed to an adaptive resolution circuit for a capacitance-sensing circuit. The adaptive resolution circuit can be used to modify a resolution of the capacitance-sensing circuit. The adaptive resolution circuit measures an input of the capacitance-sensing circuit and determines an optimum resolution for the CDC conversion by the capacitance-sensing circuit. This would be like setting a multimeter device to measure mV or V depending on the intended input. The embodiments described herein can measure the effective input capacitance and determine the optimum measurement resolution, which in term creates the maximum possible sensitivity for the circuit for a given input. For example, when measuring a touch signal, the adaptive resolution circuit can set the capacitance-sensing circuit to a first resolution (think setting the multimeter to 1V sensitivity), and when measuring a stylus signal, the adaptive resolution circuit can set the capacitance-sensing circuit to a second resolution (think setting the multimeter to 1 mV sensitivity). The capacitance-sensing circuit can use any type of capacitance measurement technique, such as CSD (CapSense Sigma Delta), CSA (CapSense Successive Approximation), or the like. The embodiments described herein can be used to measure mutual capacitance, self-capacitance, or a combination of both.

Figure 2:
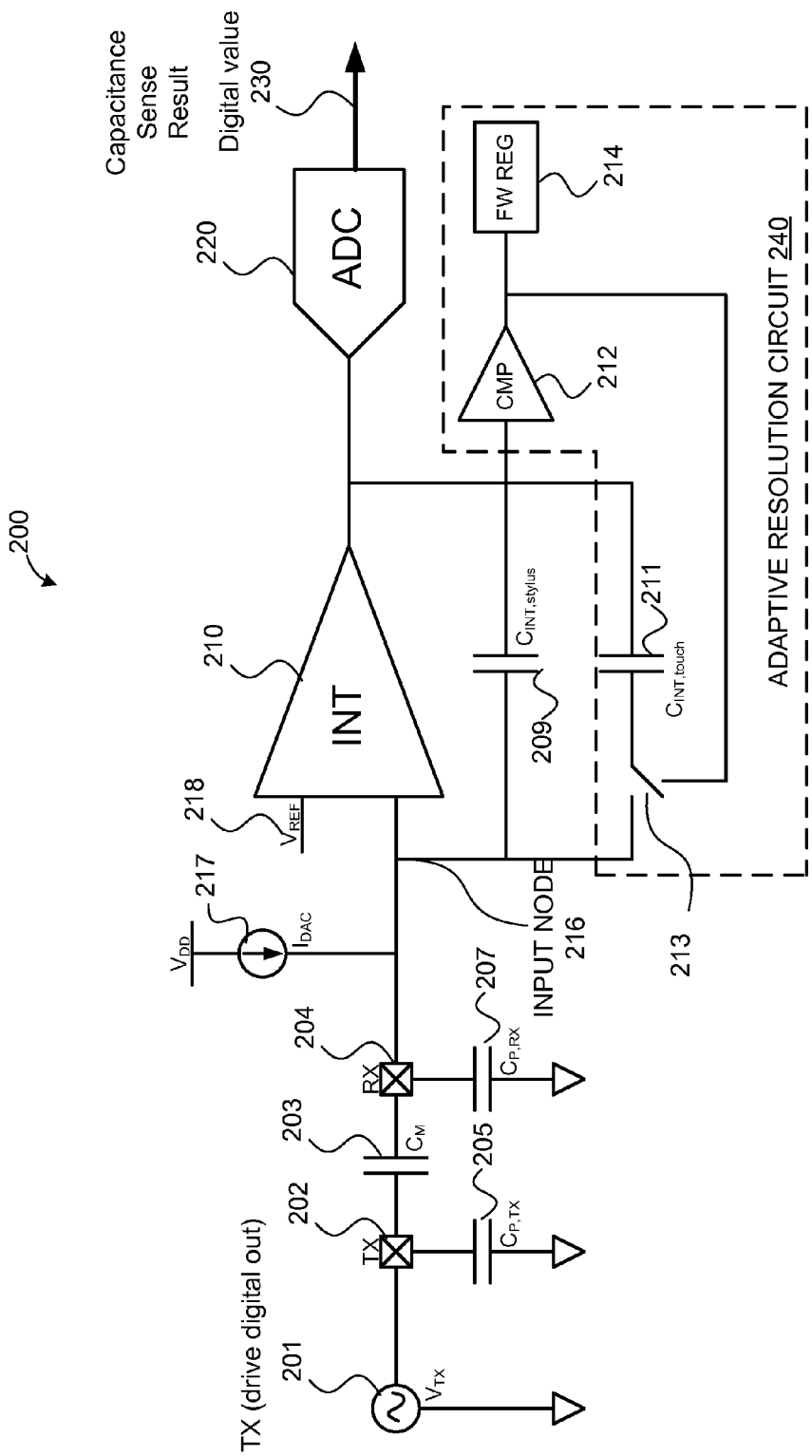
FIG. 2 is a circuit diagram illustrating a capacitance-sensing circuit including an adaptive resolution circuit according to one embodiment.

FIG. 2 is a circuit diagram illustrating a capacitance-sensing circuit 200 including an adaptive resolution circuit 240 according to one embodiment. The capacitance-sensing circuit 200 includes an integrator 210, a programmable current source 217, two integrator capacitors 209 ($C_{INT,stylus}$) and 211 ($C_{INT,touch}$), a TX signal generator 201, adaptive resolution circuit 240, and ADC 220. The integrator 210 measures current input at an input node 216. In particular, a TX signal generator 201 generates a TX signal and applies the voltage on a TX electrode 202 (TX pin). The integrator 210 measures the injected current through a RX electrode 204 (RX pin). The TX electrode 202 has a parasitic capacitance 205 ($C_{PTX}$) (a capacitance to ground) and the RX electrode 204 has a parasitic capacitance 207 ($C_{PRX}$). The current at input node 216 is integrated by the integrator 210, and the corresponding voltage that is measured provides insight into the change in mutual capacitance 203 ($C_M$) between the TX electrode 202 and the RX electrode 204. In one embodiment, the input node 216 is a node of an analog multiplexer bus (also referred to as AMUXBUSA). The other input of integrator 210 is a voltage reference 218 (Vref). The input current of the integrator 210 is balanced with the programmable current source 217, and the remaining current is integrated on an integration capacitance for a fixed period of time. The integration capacitance is selectively modified by the adaptive resolution circuit 240 as described in more detail below. The ADC 220 measures the voltage on the output of the integrator 210 and converts the voltage to a digital value 230. The digital value 230 represents the capacitance sense result. It should be noted that the TX electrode 202 and RX electrode 204 represent one intersection of a touch surface, such as a touch surface of a touchscreen, touchpad, a panel, or the like. The touch surface can have multiple intersections, such as multiple intersections between rows and columns or other electrode layouts.

Unlike the resolution of the capacitance-sensing circuit 100 that is fixed, the resolution of capacitance-sensing circuit 200 is adaptive. As described above, the actual resolution is related to the reference of the ADC 220, the size of integration capacitance ($C_{INT}$), and the granularity of the programmable current source 217 (IDAC). Instead of fixing these parameters in firmware as done conventional, the embodiments described herein can selectively modify the integration capacitance or can change a reference of the ADC 220. In FIG. 2, the adaptive resolution circuit 240 can selectively modify the integration capacitance by selectively coupling an additional capacitor 211 ($C_{INT,touch}$) in parallel to an integrator capacitor 209 ($C_{INT,stylus}$). In this matter, the reference of the ADC 220, the sizes of the integrator capacitors and the granularity of the programmable current source 217 can be set in firmware, and the adaptive resolution circuit 240 can operate the capacitance-sensing circuit 200 at two different resolutions. In one embodiment, the first resolution can be set so the capacitance-sensing circuit 200 can detect a stylus signal and the second resolution can be set so the capacitance-sensing circuit 200 can detect a finger signal. As described above, the signal level for a passive stylus is much smaller than a typical finger signal. So, when a passive stylus is put on a touch surface, the change in voltage can be readily noticed by the capacitance-sensing circuit 200 with the first resolution. Once the capacitance-sensing circuit 200 saturates, the capacitance-sensing circuit 200 can use the second resolution to detect the change in voltage by a finger. To properly measure the passive stylus, the capacitance-to-digital conversion (CDC) range by the capacitance-sensing circuit 200 can be adaptively tuned down to a smaller resolution than when measuring a finger. The capacitance-sensing circuit 200 with the adaptive resolution circuit 240 allows these two touch types to be measured by the same capacitance-sensing circuit 200 using the same integration time.

It should be noted that even though the adaptive resolution circuit 240 can selectively modify the integration capacitance, the programmable current source 217 (IDAC) can be calibrated so that the voltage that is measured for no inputs is a known value. This known value is typically set to be at a mid-scale of the ADC 220 for stylus detection. When the ADC 220 measures anything other than mid-scale, then this new voltage is a result in a change in mutual capacitance 203, resulting from a touch by a stylus on or near an intersection between the TX electrode 202 and the RX electrode 204. The selective coupling of the additional capacitor 211 changes the gain of the integrator 210. In other embodiments, instead of selectively modifying the integration capacitance, the adaptive resolution circuit 240 can modify a voltage reference of the ADC 220 as described with respect to FIG. 8.

As described above, the adaptive resolution circuit 240 is coupled to the input node 216 and an output of the integrator 210. The adaptive resolution circuit 240 is configured to selectively modify an integration capacitance of the integrator 210 to set the integrator to measure the mutual capacitance 203 with either a first resolution or a second resolution. In one embodiment, the adaptive resolution circuit 240 includes an additional capacitor 211 ($C_{INT,touch}$), a comparator 212, a switch 213 and a register 214. The comparator 212 is coupled to the output of the integrator 210 and the switch 213 is coupled to an output of the comparator 212. The comparator 212 is configured to selectively switch the capacitor 211 in parallel to the integrator capacitor 209 to modify the integration capacitance of the integrator 210 for the second resolution.

Figure 6:
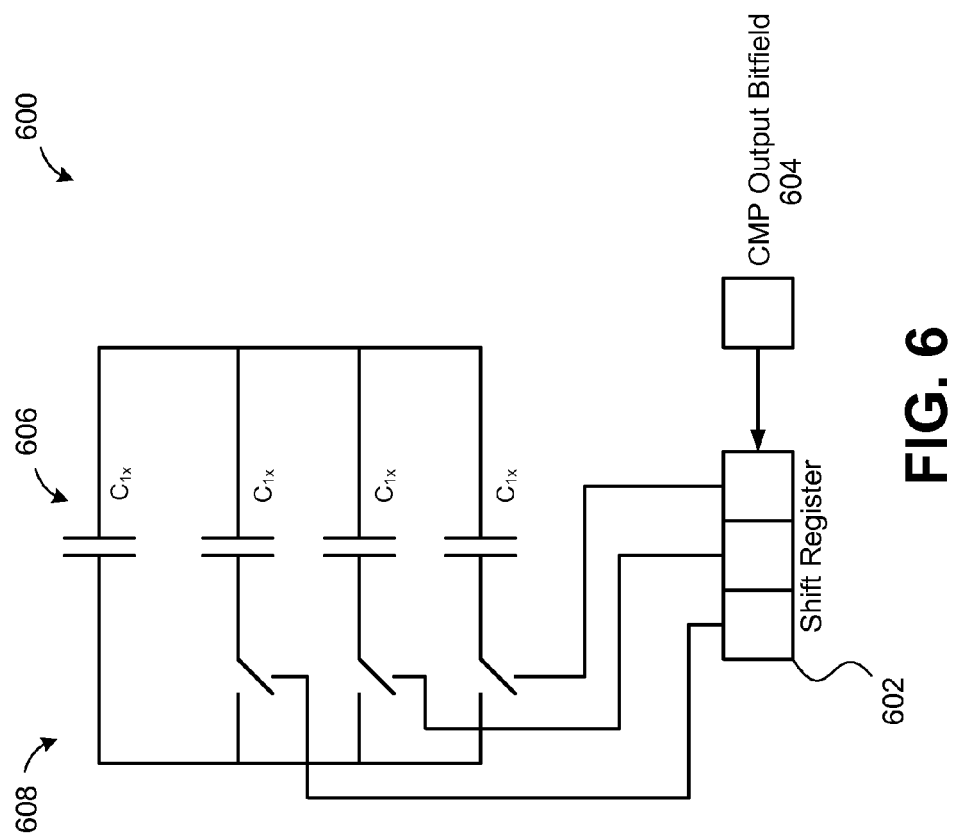
FIG. 6 is a circuit diagram illustrating an adaptive resolution circuit including a shift register according to one embodiment.
Figure 7:
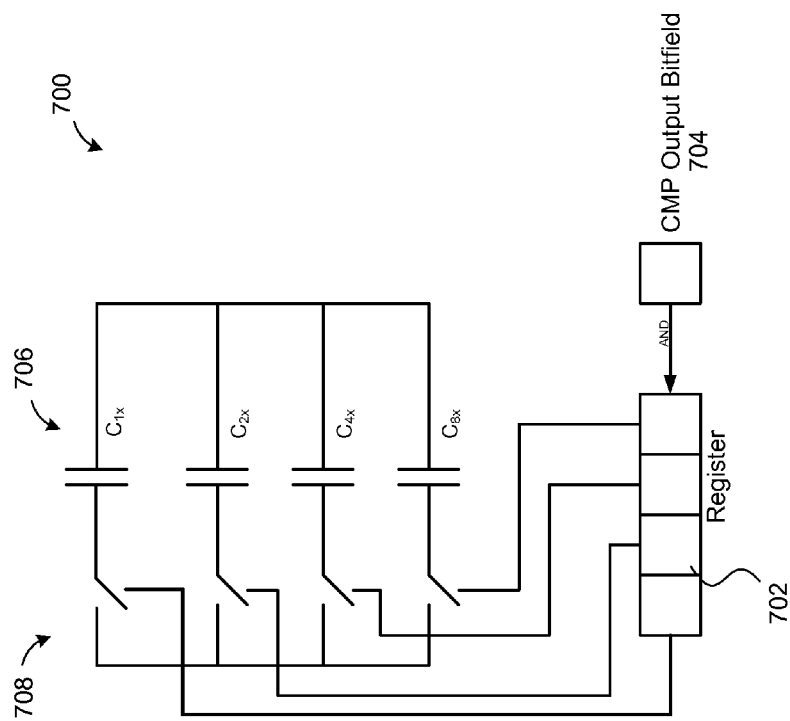
FIG. 7 is a circuit diagram illustrating an adaptive resolution circuit including a successive approximation register (SAR) according to another embodiment.

The adaptive resolution circuit 240 also includes a control circuit that includes a register 214. In the embodiment of FIG. 2, the register 214 can track switches between the transitions in resolution for the firmware. In another embodiment, the control circuit can be more complex to determine when to switch in one or more additional capacitors, as described herein. In one embodiment, the register 214 is a shift register, as illustrated in FIG. 6, which is used to set the variable integration capacitance using one or more capacitors based on the output of the comparator 212. In another embodiment, the register 214 is a register, as illustrated in FIG. 7, which is used to set the variable integration capacitance using one or more capacitors based on the output of the comparator 212.

In FIG. 2, a single capacitor 211 is switched into parallel with an integrator capacitor 209. In other embodiments, the adaptive resolution circuit 240 may include multiple switches coupled to a bank of capacitors, and the comparator 212 and register 214 can be used to select different combinations of the bank of capacitors to selectively modify the integration capacitance of the integrator 210. That is the adaptive resolution circuit 240 can selectively couple one or more of the bank of capacitors to the input node 216 to modify the integration capacitance of the integrator 210 to multiple resolutions other than the first resolution. The total integration capacitance is the capacitance of the capacitor 209 and the selected combination of the bank of capacitors.

In one embodiment, the programmable current source 217 is a single programmable current source that can be configured to operate as a current source or a current sink. For example, the programmable current source 217 can be configured as a current source to the input node 216 during a portion of a TX cycle of the TX signal and as a current sink to the input node 216 during another portion of the TX cycle. In another embodiment, the programmable current source 217 includes two separate programmable current sources, one programmable current source is configured as a current source and the other programmable current source is configured as a current sink.

During operation of the capacitance-sensing circuit 200 with a first resolution, the input node 216 is coupled to a capacitance sense pin, which is coupled to a RX electrode 204 of a sense array. The TX signal generation circuit 201 generates a TX signal to drive a TX electrode 202 of the sense array. A mutual capacitance between the first electrode and the second electrode is represented as capacitor 203 ($C_M$). Set to the first resolution, the adaptive resolution circuit 240 deactivates the switch 213, and the RX signal on the input node 216 is integrated by the integrator 210 with the integrator capacitor 209. The ADC 220 converts the integrated signal into a first digital value 230. The first digital value 230 represents a mutual capacitance between the RX electrode 204 and the second electrode 206, $C_M$ 203 at the first resolution. The digital value 230 can be further processed by a processing device (e.g., 1010 of FIG. 10) or a host (e.g., 1050 of FIG. 10). The adaptive resolution circuit 240 measures the output of the integrator 210 with the comparator 212. When the output signal of the integrator 210 is above a comparator threshold, the adaptive resolution circuit 240 can activate the switch 213 to couple the additional capacitor 211 ($C_{INT,touch}$) in parallel to the integrator capacitor 209. The RX signal on the input node 216 is integrated by the integrator 210 with a different integration capacitance, as defined by the integrator capacitor 209 in parallel with the additional capacitor 211 (e.g., $C_{INT}=C_{INT,stylus}+C_{INT,touch}$). The ADC 220 converts the integrated signal into a second digital value 230. The digital value 230 represents a mutual capacitance between the RX electrode 204 and the second electrode 206, $C_M$ 203 at the second resolution. Similarly, additional capacitors can be switched into parallel (or in other configurations) to selectively modify the integration capacitance to selectively modify the resolutions of the capacitance-sensing circuit 200.

In one embodiment, a processing device includes an integrator, a multiplexer bus coupled to an input of the integrator. The multiplexer is configured to selectively couple the input node to an electrode of a sense array. An adaptive resolution circuit is coupled to the input node and the output of the integrator. The adaptive resolution circuit is configured to selectively modify an integration capacitance of the integrator to set the integrator to measure a capacitance associated with the electrode with one of multiple programmable resolutions. In a further embodiment, the processing device includes an ADC coupled to an output of the integrator to convert an integrated capacitance to a digital value. In a further embodiment, the adaptive resolution circuit includes an adaptive capacitance circuit to provide a variable capacitance, a comparator coupled to the output of the integrator, and a control circuit coupled to an output of the comparator. The control circuit is configured to set the variable capacitance of the adaptive capacitance circuit to selectively modify the integration capacitance of the integrator.

In another embodiment, the capacitance-sensing circuit 200 is configured to sense a small passive stylus at the same time as a normal finger touch. The level of sensitivity between these two touch input domains may be twenty-five times (25×) or greater. In other words, a passive stylus may have a signal of 10 and a finger may have a signal of 250. The larger finger signal can easily swamp out the small stylus signal, which means the stylus cannot be accurately reported or even detected by a conventional touch screen controller. However, touch screen controllers that utilize the capacitance-sensing circuit 200 can detect both signals.

As described and illustrated with respect to FIG. 2, the capacitance-sensing circuit 200 uses two integration capacitors and the adaptive resolution circuit 240 for detecting the measured signal modifying a resolution of the capacitance-sensing circuit 200 based on the measured signal. The adaptive resolution circuit 240 can be a signal detection circuit to detect the signal and control circuitry to modify either the integration capacitance or the reference of the ADC 220 as described herein. The smaller integration capacitor is more sensitive than the larger integration capacitor, so it can be connected at all times in one implementation. If the detection circuit notices that the smaller integration capacitor has become saturated, then the detection circuit connects the larger capacitor and issue a re-measure command to the firmware. For example, this can be done by coupling the output of the comparator 212 to a register 214 that can be read by the firmware. Therefore, the finger input that saturated the stylus capacitor, can be sensed when the finger cap is connected.

Figure 3:
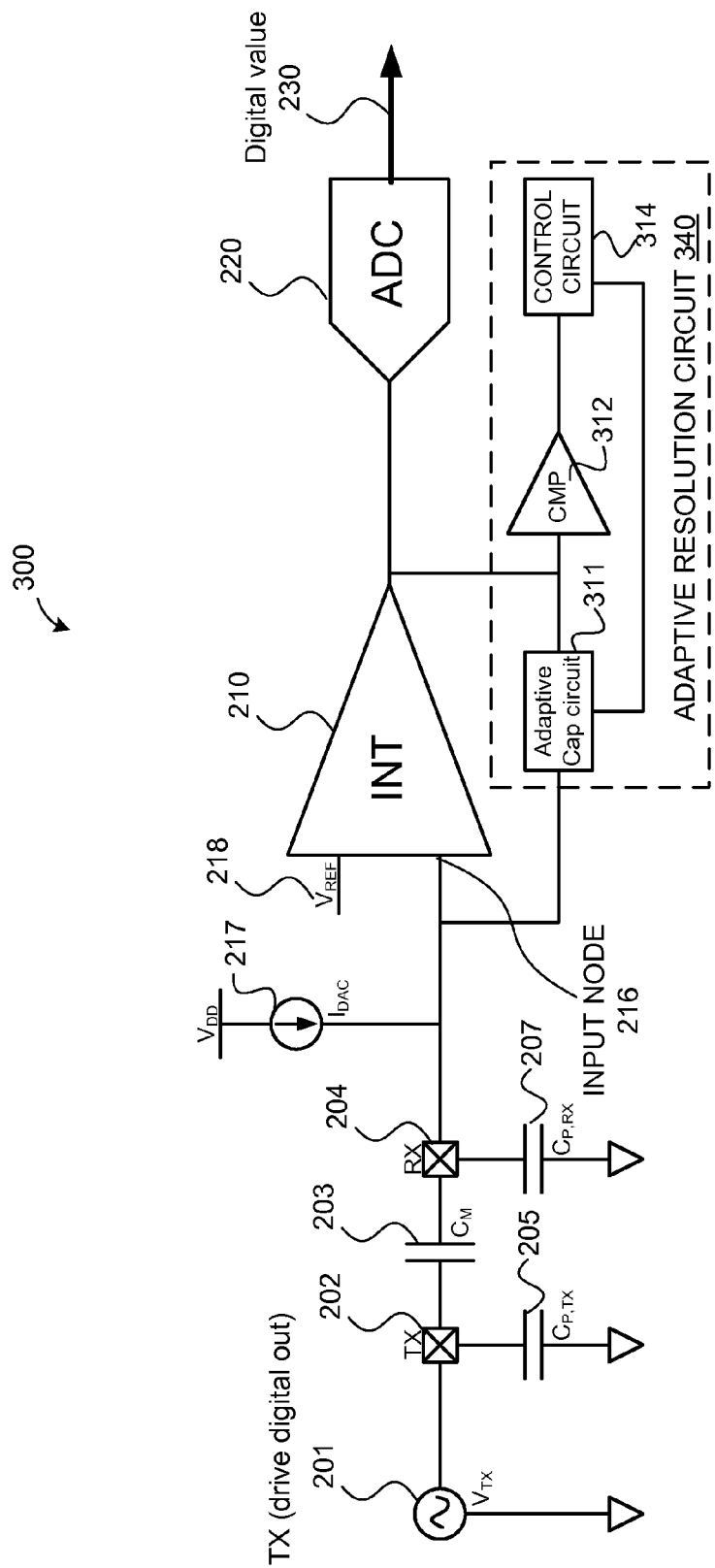
FIG. 3 is a circuit diagram illustrating a capacitance-sensing circuit including an adaptive resolution circuit according to another embodiment.

As described above, the adaptive resolution circuit shown in FIG. 2 can further be extrapolated to a bank of capacitors that can be adaptively configured to create a larger and larger integration capacitance for more levels of sensitivity than just two as done in FIG. 2. A more generalized approach to varying the integration capacitance is shown in FIG. 3. A secondary control circuit (e.g., 314 of FIG. 3) can allow for a larger distribution of integration capacitances so the adaptive resolution circuit can be tuned to maximize the sensitivity of the capacitance-sensing circuit. In other words, the input can be measured and the capacitance-sensing circuit can adaptively adjust the integration capacitance to maximize its sensitivity.

The control circuit can be as simple as the circuit shown in FIG. 2, where the integration capacitor is incrementally increased until it is no longer saturated from the input. A more intelligent detection and control circuit could also be used to converge to the appropriate capacitance value faster. For instance, a successive approximation circuit could be used to perform a binary search for the optimum capacitance, which would converge to a result much faster than the incremental approach. Another approach may be to use the largest capacitance possible (to guarantee no saturation) and use the ADC output of the first measurement to determine the necessary size of the integration capacitance for the next scan.

In the depicted embodiment, the integrator 210 is illustrated and described as an active integrator or operational amplifier integrator. In other embodiments, the integrator 210 may be a passive integrator or other device to perform integration. Also, in other embodiments, instead of selectively modifying the integration capacitance of the integrator, other integration parameters may be selectively modified. The integration parameter may be a capacitance, an input resistance or impedance, a voltage reference, or the like. In one embodiment, the input resistance of the integrator 210 can be selectively modified to set the integrator to measure at one or more different resolutions. In another embodiment, a voltage reference of the ADC 220 can be selectively modified convert the measured capacitance at one or more different resolutions.

Figure 4:
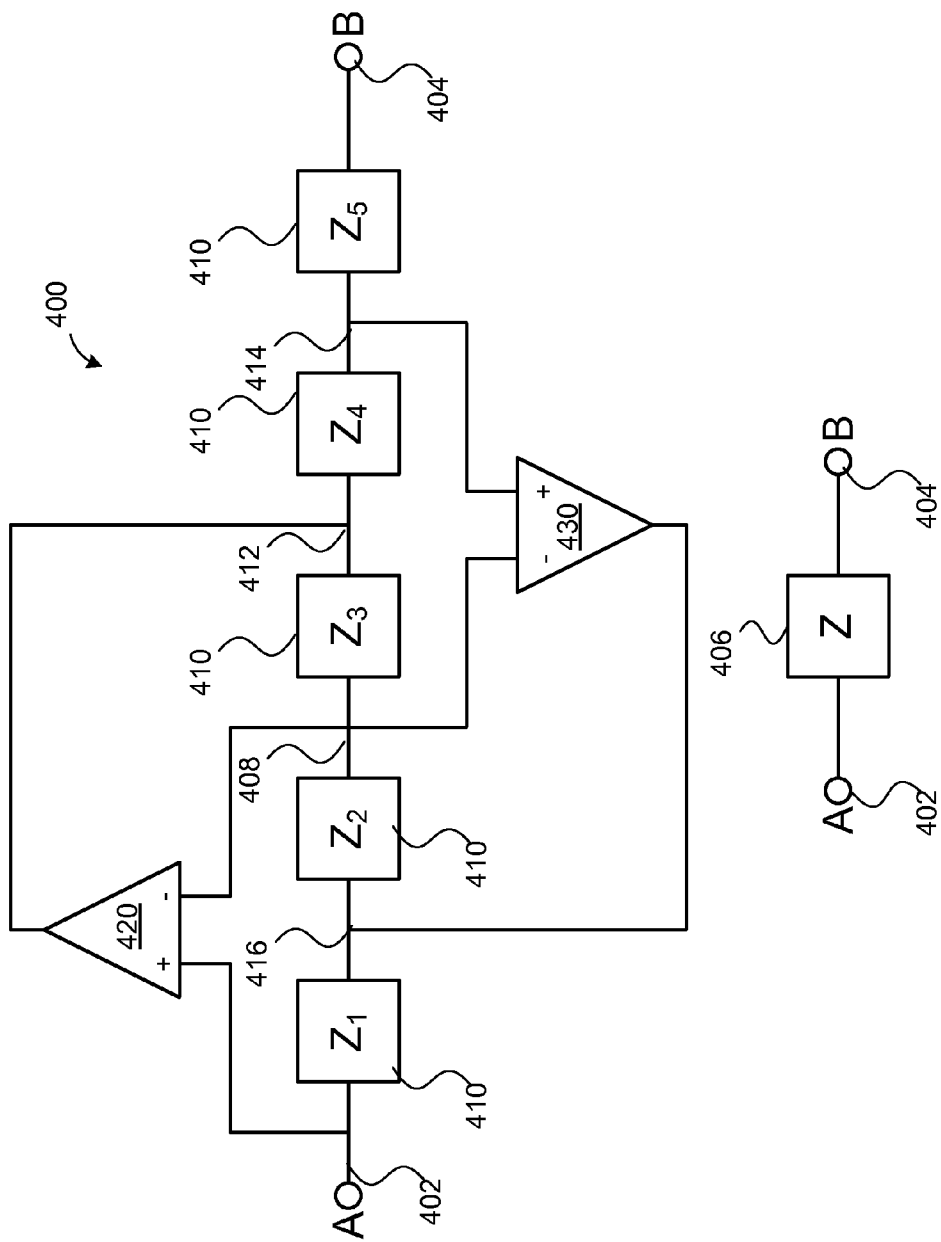
FIG. 4 is a circuit diagram illustrating a generalized impedance converter circuit according to one embodiment.
Figure 5:
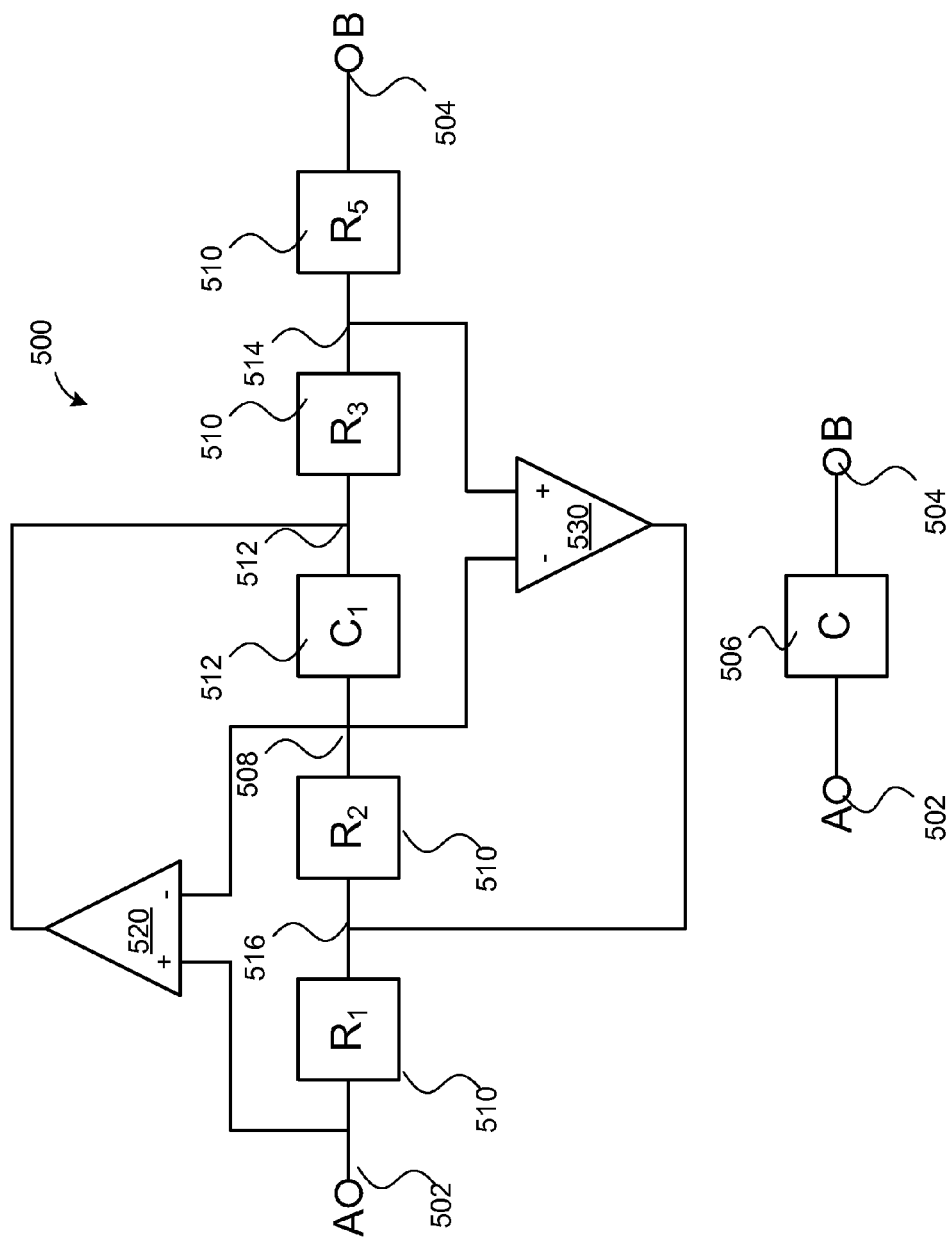
FIG. 5 is a circuit diagram illustrating an adaptive capacitance circuit according to one embodiment.

FIG. 3 is a circuit diagram illustrating a capacitance-sensing circuit 300 including an adaptive resolution circuit 340 according to another embodiment. The capacitance-sensing circuit 300 is similar to the capacitance-sensing circuit 200 as noted by similar reference numbers, except the capacitance-sensing circuit 300 includes the adaptive resolution circuit 340. The adaptive resolution circuit 340 includes an adaptive capacitance circuit 311, a comparator 312, and a control circuit 314. The adaptive capacitance circuit 311 can be used to provide an adaptive integration capacitance for the integrator 210. The adaptive resolution circuit 340 can set the adaptive capacitance circuit 311 to automatically set the resolution (i.e., sensitivity) of the capacitance-sensing circuit 300. The adaptive capacitance circuit 311 can be implemented using various circuit elements and various circuit configurations to create varying capacitance levels. One implementation is illustrated in FIG. 5. In another embodiment, the adaptive resolution circuit 340 includes an impedance converter circuit instead of the adaptive capacitance circuit 311. One implementation of the impedance converter circuit is illustrated in FIG. 4. The control circuit 314 is configured to select the capacitance for the adaptive capacitance circuit 311 as well as communicating the resolution of the adaptive capacitance circuit 311 being used so that the equation CV=Q can be properly analyzed.

In one embodiment, the adaptive capacitance circuit 311 can be configured to provide a variable capacitance (i.e., set to have different capacitance values). The adaptive capacitance circuit 311 is configured to operate as an integrator capacitor of the integrator 210. The comparator 312 is coupled to the output of the integrator 210 and measures the integrated signal. The comparator 312 is configured to selectively set the variable capacitance of the adaptive capacitance circuit 311 to modify the integration capacitance of the integrator 210 for the second resolution (variable resolution). In one embodiment, the control circuit 314 is coupled to the output of the comparator 312 and can be used to determine the capacitance level needed for the adaptive capacitance circuit 311. The control circuit 314 sets the adaptive capacitance circuit 311 based on the output of the comparator 312. In one embodiment, the control circuit 314 includes a shift register to set the adaptive capacitance circuit 311 to an appropriate value for a given resolution. In another embodiment, the control circuit 314 includes a register to set the adaptive capacitance circuit 311 to an appropriate value for a given resolution. Additional details of the control circuit 314 are described below with respect to FIGS. 6 and 7. It should be noted that the depicted embodiment, shows the adaptive capacitance circuit 311 as the integrator capacitor of the integrator 210. However, in other embodiments, the adaptive capacitance circuit 311 can be used in connection with an integrator capacitor (e.g., 209) of the integrator 210.

In one embodiment, the impedance converter circuit (substituted for the adaptive capacitance circuit 311) can be configured to provide a variable impedance (i.e., set to have different impedance values). The impedance converter circuit is configured to operate as an integrator capacitor of the integrator 210. The comparator 312 is coupled to the output of the integrator 210 and measures the integrated signal. Like above, the comparator 312 and the control circuit 314 are configured to selectively set the variable impedance of impedance converter circuit to modify the integration capacitance of the integrator 210 for the second resolution (variable resolution). It should be noted that the impedance converter circuit can be used in connection with or without an integrator capacitor of the integrator 210.

Embodiments described herein, such as those illustrated in FIG. 2 and FIG. 3 that provide adaptive sensitivity of the sensing circuits provide improved systems than conventional systems. The embodiments described herein provide a hardware approach to simultaneously measure a passive stylus and a normal touch. Additionally, the embodiments described can provide good noise immunity to high noise inputs such as charger noise by preventing the integration capacitor from saturating when high noise is injected into the system. Solutions today must use longer integration times and other firmware based techniques to increase sensitivity. These techniques have diminishing returns as well as other negative effects such as a reduction in scan time and report rate as describe herein. The embodiments described herein can be used to measure capacitive inputs of varying size without a manual tuning intervention. FIG. 2 shows a specific implementation of measuring two discrete capacitive input ranges. Further extending the capacitance bank of FIG. 2 would allow additional inputs ranges. Each new feedback capacitor size would indicate a new capacitance range to measure. FIG. 3 shows a generalized implementation of FIG. 2 as a proposal to use an adjustable capacitor instead of several discrete capacitors. FIG. 5 shows one possible implementation for creating such a capacitor for the adaptive capacitance circuit in FIG. 3. Any gains in sensitivity can be stored in firmware so the ADC values can be properly interpreted.

The embodiments described herein can provide one or more improvements. One improvement may be a higher sensitivity for small capacitive inputs without affecting the sensitivity of larger capacitance inputs. This manifests itself in two different ways. Firstly, if the panel hardware is tuned for small inputs, than the larger inputs produce false positives for smaller inputs at the periphery of the touch. In other words, the edges of a large touch have small signal levels close enough signify to the firmware that a small touch is present (such as a passive stylus). Secondly, if the panel is tuned for larger touches, than the firmware will also not detect the smaller touch objects. So, the embodiments described herein can provide two improvements here; the embodiments can eliminate false positives (reported touches that are not there) and false negatives (un-reported touches that are there). These problems are especially relevant when the firmware must support a large range of expected touch inputs.

The embodiments described herein can provide an adaptive sensitivity adjustment for varying sizes of capacitive inputs. This may allow the touchscreen controller to measure the full range of measurements at the same time, which no conventional system can currently do. FIG. 1 shows the previous method, which uses a static integration capacitor to measure input capacitance. Although this cap can be changed through firmware for some touch screen solutions, once chosen the value is static for any measurements on the touch screen. Additionally, because of silicon area, the number of selections is often limited, which means the range of the measurement is also limited. FIGS. 2 and 3 show improvements to the existing circuit which measure the capacitive input and decide the necessary level of sensitivity.

In one embodiment, the capacitance-sensing circuit includes the following: 1) adaptive integration capacitance: either through a capacitance bank (FIG. 2), impedance converter (FIG. 3), or some other method; 2) a circuit to measure integration capacitance saturation. In FIGS. 2 and 3 this is the comparator (CMP); and 3) a mechanism or method to control the circuit in 1) by the outputs of 2). This could be something like a circular shift register, such as illustrated in FIG. 6, as an input to a MUX or some other hardware solution. The capacitance-sensing circuit can be implemented in an analog front end (AFE) to a touchscreen controller. The capacitance-sensing circuit with variable resolution can rely on the necessary software components to analyze the analog result and produce useful information. For example, firmware can be used to process the capacitive heat map and produce any known touch locations. This software could also be implemented on a host processor, which implies that only a digital communication interface would be needed in addition to the analog front end. In other embodiments, other capacitance measurement circuits can be used. If the input source is current, then hardware analog integration may be used to resolve the input capacitance and the sensitivity of the integration is proportional to impedance (typically capacitor). This size of this impedance dictates the level of sensitivity. So, the measurement circuit can be configured to sense the level of the input and change this impedance to match the necessary level of sensitivity.

FIG. 4 is a circuit diagram illustrating a generalized impedance converter circuit 400 according to one embodiment. This type of circuit uses two operational amplifiers 420, 430 and five circuit elements 410. These circuit elements 410 can be capacitors or resistors. Depending on the placement of the capacitors and resistors (410), the generalized impedance converter circuit 400 can produce a varying type of impedance 406. The generalized impedance converter circuit 400 can look like a resistor, capacitor, inductor, or even negative resistor. This type of circuit is used in filtering applications or in integrated circuit (IC) designs that cannot afford to use a real inductor because of the physical size. The transfer function of this circuit is shown in Equation 1.

$$Z = \frac{Z_1 Z_3 Z_5}{Z_2 Z_4} \qquad \text{Equation 1}$$

In the depicted embodiment, the impedance converter circuit 400 includes multiple circuit elements 410 coupled in series between an input terminal 402 and an output terminal 404. A first operational amplifier 420 includes inputs coupled between the input terminal 402 and a first intervening node 408 and an output coupled to a second intervening node 412. A second operational amplifier 430 includes inputs coupled between the first intervening node 408 and a third intervening node 414 and an output coupled to a fourth intervening node 416.

FIG. 5 is a circuit diagram illustrating an adaptive capacitance circuit 500 according to one embodiment. The type of circuit of FIG. 4 can be configured as a variable capacitance circuit. The adaptive capacitance circuit 500 uses two operational amplifiers 520, 530 and a capacitive element 512 and four resistive elements 510. Instead of providing a varying type of impedance 406, the adaptive capacitance circuit 500 provides a variable type of capacitance 506. In one embodiment, the adaptive capacitance circuit 500 is a general impedance converter configured to provide a variable capacitance. For example, if one or more of the resistors are variable, then the total capacitance of the circuit is also variable. The variable capacitance of this circuit is shown in Equation 2.

$$C = C_1 \left( \frac{R_1 R_4}{R_2 R_3} \right) \qquad \text{Equation 2}$$

In the depicted embodiment, the adaptive capacitance circuit 500 includes multiple resistive elements 510 coupled in series between an input terminal 502 and an output terminal 504 and a capacitive element couple between two intervening resistive elements. A first operational amplifier 520 includes inputs coupled between the input terminal 502 and a first intervening node 508 and an output coupled to a second intervening node 512. A second operational amplifier 530 includes inputs coupled between the first intervening node 508 and a third intervening node 514 and an output coupled to a fourth intervening node 516.

FIG. 6 is a circuit diagram illustrating an adaptive resolution circuit 600 including a shift register 602 according to one embodiment. The adaptive resolution circuit 600 implements a straight linear adder to set the variable capacitance. In this embodiment, a first capacitor of a bank of capacitors 606 is always set for a default integration capacitance. If the output of the comparator, represented by CMP output bitfield 604, is HIGH then the output is placed in the leftmost field of the shift register 602, which adds in another capacitor (lower capacitor) of the capacitor bank. For example, a first switch can be controlled by the leftmost field of the shift register 602 to couple the additional capacitor in parallel to the first capacitor. If the output of the CMP output bitfield 604 is again HIGH, then the shift register 602 shifts the elements to the left, which turns on the middle capacitor and the lower capacitor of the capacitor bank 606. If the CMP output bitfield 604 is low, the shift register 602 does not add in a capacitor and knows it is at its optimal resolution. It should be noted that the adaptive resolution circuit 600 is illustrated and described using four capacitors in the capacitor bank 606 and three elements in the shift register 602. In other embodiments, other number of capacitors in the capacitor bank 606 and elements in the shift register 602 can be used.

Instead of a shift register, a normal register can be used where a pointer of the comparator is shifted along a length of the register as illustrated in FIG. 7.

FIG. 7 is a circuit diagram illustrating an adaptive resolution circuit 700 including a successive approximation register (SAR) 702 according to another embodiment. The adaptive resolution circuit 700 implements a SAR approach to set the variable capacitance. In this embodiment, a first capacitor of a bank of capacitors 706 is always set for a default integration capacitance. A pointer of the comparator can be shifted along the length of the register 702 and an output of the comparator, represented as CMP output bitfield 704, is AND'ed with a bit of the element of the register 702. For example, one capacitor of the capacitor bank 706 that corresponds to the element can be set or not based on AND operation of the comparator output 704 and the bit of the element. If the bit is set to '1' and the CMP output bitfield 704 is '1', then the capacitor is set (or selected). That is the corresponding switch is activated to couple the capacitor in parallel to the first capacitor when set. If the CMP output bitfield 704 is '0', then the capacitor should not be set.

For example, for the adaptive resolution circuit 700, the highest possible C value is 15, and the smallest is 1. Any number from 1 to 15 can be chosen by adding at least some of the 1×, 2×, 4× and 8× capacitors. So, the SAR logic determines out what value to choose between 1 and 15 in exactly 3 tests. Firstly, C1X is selected. Next, C8X is set. If the result is saturated, then 8X isn't good enough and it should remain being SET. If the result isn't saturated, then the value of 8X is too high so it should not be SET. Hence, the setting of the bit is a logical AND with the result. The C4X, C2X, and C1X are tested in the same way. At the end, the optimum value would be selected. So, for an example, say the desired value is C13X, the C8X is set and because C13X is needed, C8X will be saturated and the CMP will be high, so C8X is left selected. Next, C4X is set, resulting in C8X+C4X=C12X. Again, the CMP will be high so C4X is left set. Next, C2X is set, resulting in C8X+C4X+C2X=C14X. This value is bigger than 13X so CMP would be low. In this case, the C2X bit would be cleared. Finally, C1X can be tested, resulting in C8X+C4X+C1X=C13X, which is the desired resolution. Depending on how the circuit is made or the logic is done, this bit may also be cleared because it is so close to the right answer that it may or may not saturate the CMP in practice.

Figure 8:
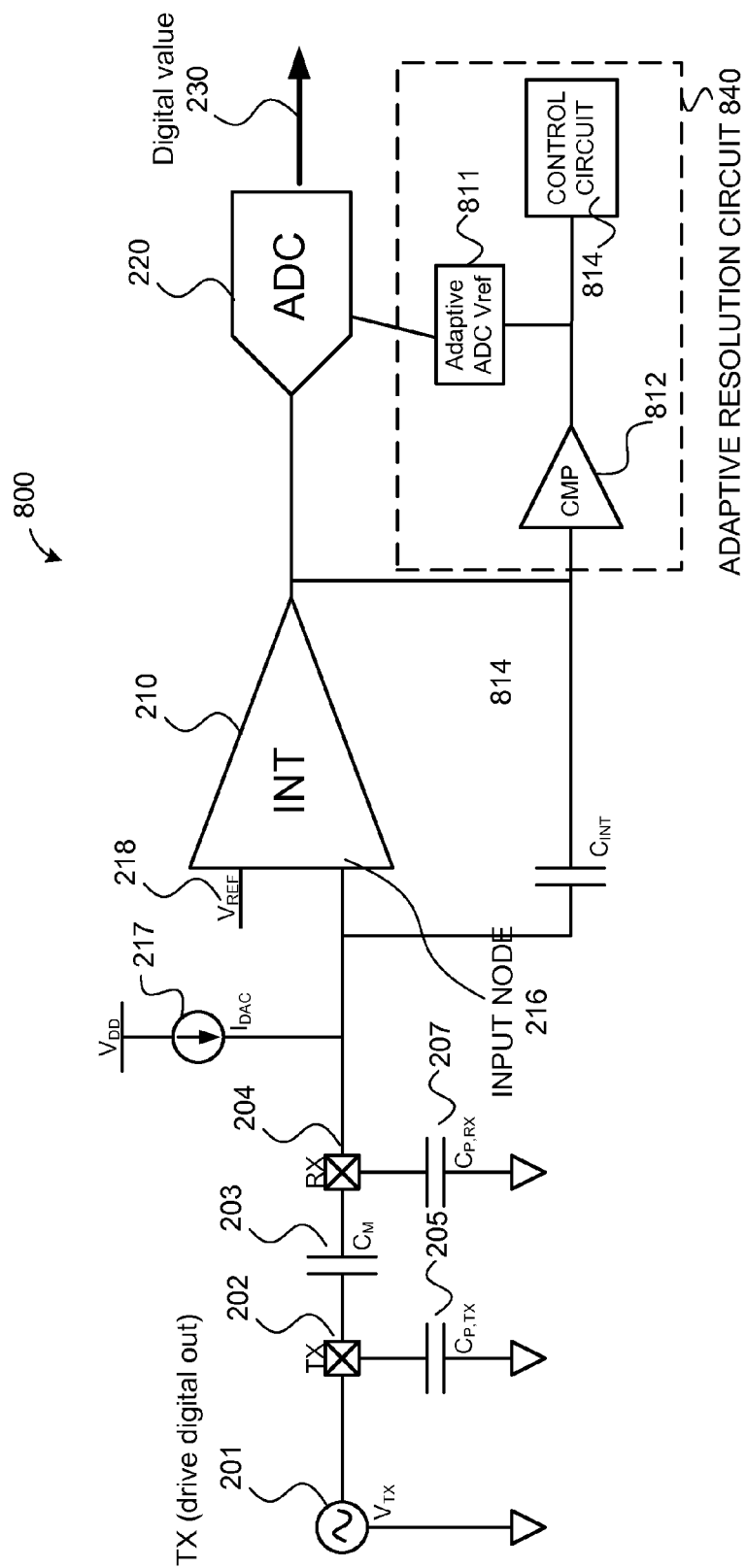
FIG. 8 is a circuit diagram illustrating a capacitance-sensing circuit including an adaptive resolution circuit according to another embodiment.

A similar approach to the idea of adaptively adjusting the sensitivity of the capacitance-sensing circuit (of a touch screen system) is to adjust an ADC reference, instead of the integration capacitance. For example, a larger ADC reference means there is a low resolution, because the ADC must span more voltage with the same number of bits. FIG. 8 shows a generalized approach to adaptively adjusting the sensitivity (resolution) by selectively modifying the ADC reference.

FIG. 8 is a circuit diagram illustrating a capacitance-sensing circuit 800 including an adaptive resolution circuit according to another embodiment. The capacitance-sensing circuit 800 is similar to the capacitance-sensing circuit 200 as noted by similar reference numbers, except the capacitance-sensing circuit 800 includes the adaptive resolution circuit 840. The adaptive resolution circuit 840 includes an adaptive ADC voltage reference (Vref) circuit 811 coupled to an output of a comparator 812. The adaptive resolution circuit 840 also includes a control circuit 814, which is similar to the control circuit 314 as described above. Unlike the adaptive capacitance circuit 311 of FIG. 3 that provides an adaptive integration capacitance for the integrator 210, the adaptive ADC Vref circuit 811 is configured to selectively modify a voltage reference for the ADC 220 to convert the measured capacitance with the second resolution (variable resolution). The adaptive resolution circuit 840 can set the voltage reference (ADC reference) to automatically set the resolution (i.e., sensitivity) of the ADC 220. It should be noted that the embodiments illustrated and described with respect to FIG. 8 show methods to adaptively adjust 'V' in the equation CV=Q, whereas the embodiments described above with respect to FIGS. 2 and 3 show methods to adaptively adjust 'C' in the equation CV=Q. Either way, the charge (Q) being measured has a different resolution when selectively modifying 'C' or 'V' using the adaptive resolution circuits.

In one embodiment, the comparator 812 measure the integrated signal output from the integrator 210 to determine a resolution of the ADC 220 and can adjust the voltage reference accordingly to set the resolution. In one embodiment, the control circuit 814 is coupled to the output of the comparator 812 and can be used to determine the voltage reference needed for the ADC 220. The control circuit 814 sets the adaptive ADC Vref circuit 811 based on the output of the comparator 812. In one embodiment, the control circuit 814 includes a shift register to set the adaptive ADC Vref circuit 811 to an appropriate value for a given resolution. In another embodiment, the control circuit 814 includes a register to set the adaptive ADC Vref circuit 811 to an appropriate value for a given resolution.

Although not illustrated in FIG. 8, the adaptive ADC Vref circuit 811 can modify an output voltage to selectively modify the ADC reference for the ADC 220. Modifying an output voltage can be achieved through a simple resistor based voltage divider, or through an active circuit using an operational amplifier as a buffer with gain.

It should be noted that conventional touch screen controllers that can change the integration capacitance or voltage references through firmware still requires the firmware to detect this condition and then re-scan with the new settings. These conventional solutions are slower than the embodiments described herein that can utilize hardware to detect and adjust the resolution of the integrator 210 or the ADC reference, as described herein.

The embodiments described herein can be implemented in a touchscreen controller used in a touchscreen device, such as a point of sale terminals, trackpads, or any other touch input device. The embodiments described herein can also be used in other touch devices, such as a computer trackpad, or other types of touch input devices. Also, passive stylus is rapidly becoming a standard market feature. As described above, conventional solutions do not permit detection of the stylus with touches on the same screen. This may mean that palm and grip rejection are not possible in these solutions. The embodiments described herein may be used in connection with features, such as palm and grip rejection features. The embodiments described herein may also provide a noise abatement procedure for normal touches, which may be an improvement over the conventional data filtering methods.

Figure 9:
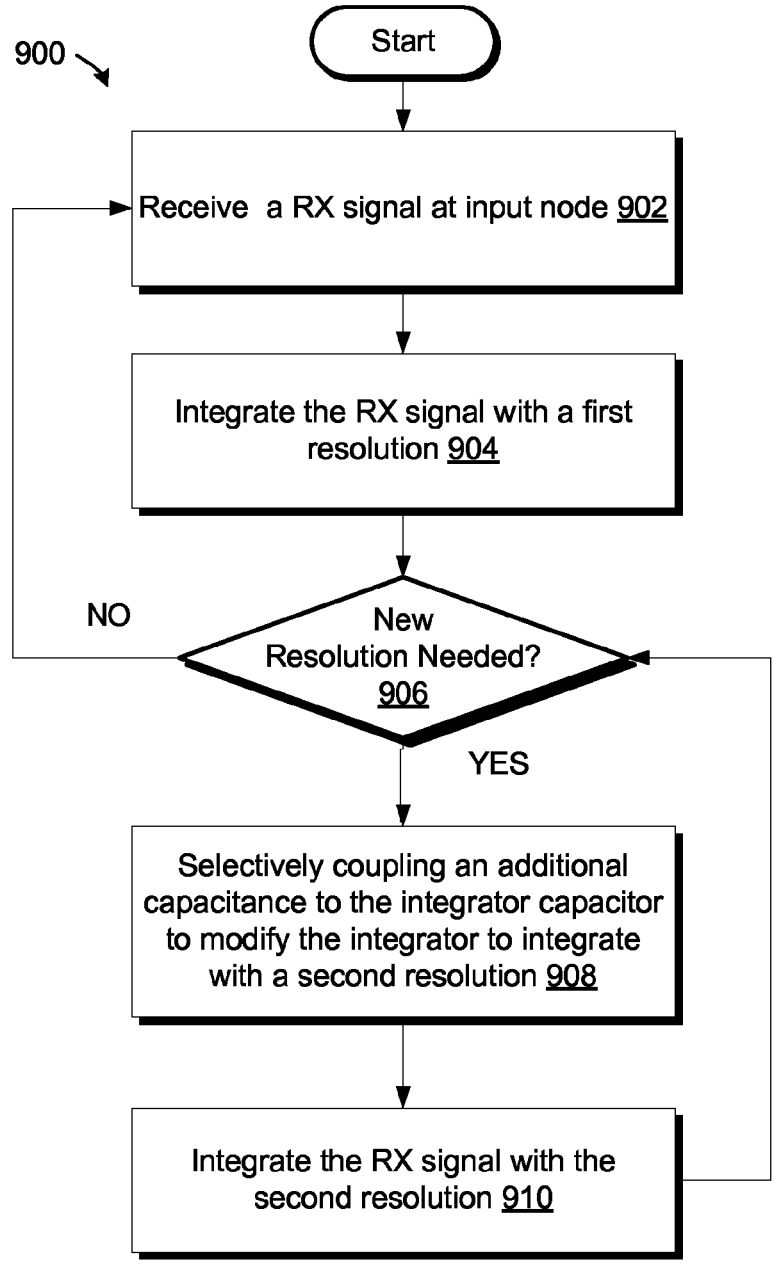
FIG. 9 is a flow diagram of a method of adaptive resolution for capacitance measurement according to an embodiment

FIG. 9 is a flow diagram of a method 900 of adaptive resolution for capacitance measurement according to an embodiment. The method 900 may be performed by processing logic that may comprise hardware (circuitry, dedicated logic, etc.), software (such as is run on a general purpose computing system or a dedicated machine), firmware (embedded software), or any combination thereof. In one embodiment, the capacitance-sensing circuit 200 of FIG. 2 or capacitance-sensing circuit 300 of FIG. 3 performs the method 900. In one embodiment, the processing device 1010 performs the method 900. In another embodiment, the adaptive resolution circuit 1020 performs the method 900. Alternatively, other components of the electronic system 1000 perform some or all of the operations of method 900.

Referring to FIG. 9, the method 900 begins with processing logic receiving at an input node of a capacitance-sensing circuit a receive (RX) signal on a capacitance sense pin coupled to an electrode of a sense array (block 902). The processing logic integrates the RX signal by an integrator comprising an integrator capacitor with a first resolution of the capacitance-sensing circuit (block 904). The processing logic determines if a new resolution is needed (e.g., integration capacitance is saturated or near saturated) (block 906). If no new resolution is needed, the processing logic returns to block 902. If a new resolution is needed at block 906, the processing logic selectively couples an additional capacitance to the integrator capacitor to modify the integrator to integrate with a second resolution (block 908). In other embodiments, one or more additional capacitors can be coupled to the integrator capacitor to vary the integration capacitance to one or more different levels. At block 910, the processing logic integrates the RX signal by the integrator with the second resolution. The processing logic returns to block 906 to determine if a new resolution is needed.

In a further embodiment, at blocks 906 and 908, the processing logic compares an output of the integrator with a comparator and selectively couples a second capacitor in parallel to the integrator capacitor to modify the integration capacitance for the second resolution based on the output of the comparator. In another embodiment, at blocks 906 and 908, the processing logic compares an output of the integrator with a comparator and selectively sets an impedance of an impedance converter circuit coupled between the input node and the output of the integrator to modify the integration capacitance of the integrator for the second resolution. In another embodiment, at blocks 906 and 908, the processing logic compares an output of the integrator with a comparator and selectively sets a variable capacitance of an adaptive capacitance circuit coupled between the input node and the output of the integrator to modify the integration capacitance of the integrator for the second resolution. In a further embodiment, the processing logic receives an output of the comparator and controls the variable capacitance of the adaptive capacitance circuit using at least one of a register or a shift register as described herein.

The processing logic may perform other operations as described above with respect to FIGS. 2-8.

The methods described above regarding input signal attenuation can be implemented by a capacitance-sensing circuit with an adaptive resolution circuit, which may be implemented in a capacitive touch screen controller. In one embodiment, the capacitive touch screen controller is the TrueTouch® capacitive touchscreen controllers, such as the CY8CTMA3xx family of TrueTouch® Multi-Touch All-Points touchscreen controllers, developed by Cypress Semiconductor Corporation of San Jose, Calif. The TrueTouch® capacitive touchscreen controllers sensing technology to resolve touch locations of multiple fingers and a stylus on the touch-screens, supports leading operating systems, and is optimized for low-power multi-touch gesture and all-point touchscreen functionality. Alternatively, the touch position calculation features may be implemented in other touch-screen controllers, or other touch controllers of touch-sensing devices. In one embodiment, the touch position calculation features may be implemented with other touch filtering algorithms as would be appreciated by one of ordinary skill in the art having the benefit of this disclosure.

Figure 10:
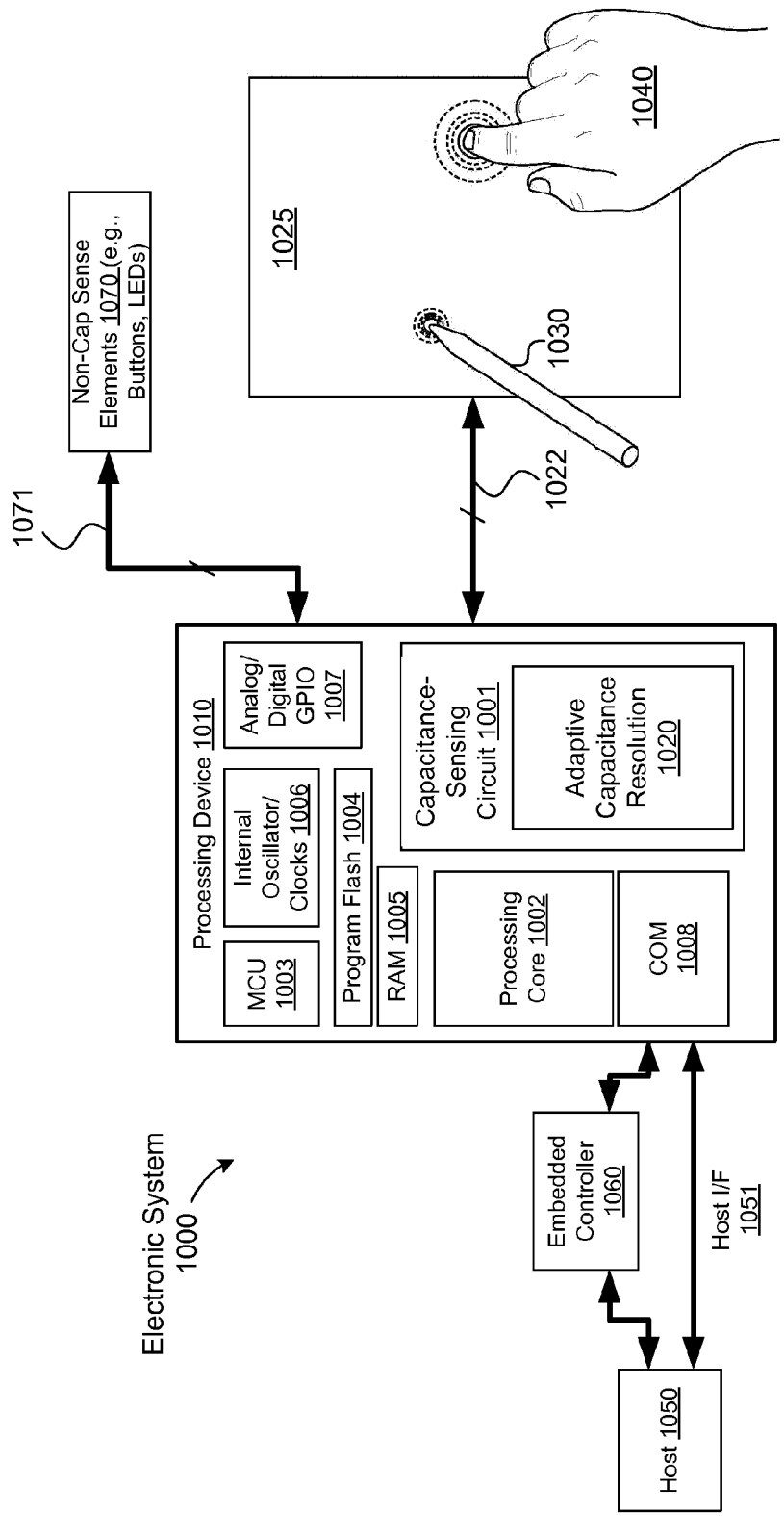
FIG. 10 is a block diagram illustrating one embodiment of an electronic system having a processing device including an adaptive resolution circuit.

FIG. 10 is a block diagram illustrating one embodiment of an electronic system 1000 having a processing device 1010 including adaptive resolution circuit 1020. Details regarding the adaptive resolution circuit 1020 are described in more detail with respect to FIGS. 2-8. The processing device 1010 is configured to detect one or more touches on a touch-sensing device, such as the capacitive sense array 1025. The processing device can detect conductive objects, such as touch objects 1040 (fingers or passive styluses, an active stylus 1030, or any combination thereof. The capacitance-sensing circuit 1001 can measure touch data on the capacitive sense array 1025. The touch data may be represented as multiple cells, each cell representing an intersection of sense elements (e.g., electrodes) of the capacitive sense array 1025. In another embodiment, the touch data is a 2D capacitive image of the capacitive sense array 1025. In one embodiment, when the capacitance-sensing circuit 1001 measures mutual capacitance of the touch-sensing device (e.g., capacitive sense array 1025), the capacitance-sensing circuit 1001 obtains a 2D capacitive image of the touch-sensing device and processes the data for peaks and positional information. In another embodiment, the processing device 1010 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware identifies the peaks using the embodiments described herein. The firmware can calculate a precise coordinate for the resulting peaks. In one embodiment, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information.

Electronic system 1000 includes processing device 1010, capacitive sense array 1025, stylus 1030, host processor 1050, embedded controller 1060, and non-capacitive sense elements 1070. The capacitive sense elements are electrodes of conductive material, such as copper. The sense elements may also be part of an ITO panel. The capacitive sense elements can be configurable to allow the capacitive-sensing circuit 1001 to measure self-capacitance, mutual capacitance, or any combination thereof. In the depicted embodiment, the electronic system 1000 includes the capacitive sense array 1025 coupled to the processing device 1010 via bus 1022. The capacitive sense array 1025 may include a multi-dimension capacitive sense array. The multi-dimension sense array includes multiple sense elements, organized as rows and columns. In another embodiment, the capacitive sense array 1025 operates as an all-points-addressable ("APA") mutual capacitive sense array. In another embodiment, the capacitive sense array 1025 operates as a coupled-charge receiver. In another embodiment, the capacitive sense array 1025 is non-transparent capacitive sense array (e.g., PC touchpad). The capacitive sense array 1025 may be disposed to have a flat surface profile. Alternatively, the capacitive sense array 1025 may have non-flat surface profiles. Alternatively, other configurations of capacitive sense arrays may be used. For example, instead of vertical columns and horizontal rows, the capacitive sense array 1025 may have a hexagon arrangement, or the like, as would be appreciated by one of ordinary skill in the art having the benefit of this disclosure. In one embodiment, the capacitive sense array 1025 may be included in an ITO panel or a touch screen panel.

The operations and configurations of the processing device 1010 and the capacitive sense array 1025 for detecting and tracking the touch object 1040 and stylus 1030 are described herein. In short, the processing device 1010 is configurable to detect a presence of the touch object 1040, a presence of a stylus 1030 on the capacitive sense array 1025, or any combination thereof. The processing device 1010 may detect and track the stylus 1030 and the touch object 1040 individually on the capacitive sense array 1025. In one embodiment, the processing device 1010 can detect and track both the stylus 1030 and touch object 1040 concurrently on the capacitive sense array 1025. If the touching object is an active stylus, in one embodiment, the active stylus 1030 is configurable to operate as the timing "master," and the processing device 1010 adjusts the timing of the capacitive sense array 1025 to match that of the active stylus 1030 when the active stylus 1030 is in use. In one embodiment, the capacitive sense array 1025 capacitively couples with the active stylus 1030, as opposed to conventional inductive stylus applications. It should also be noted that the same assembly used for the capacitive sense array 1025, which is configurable to detect touch objects 1040, is also used to detect and track a stylus 1030 without an additional PCB layer for inductively tracking the active stylus 1030.

In the depicted embodiment, the processing device 1010 includes analog and/or digital general purpose input/output ("GPIO") ports 1007. GPIO ports 1007 may be programmable. GPIO ports 1007 may be coupled to a Programmable Interconnect and Logic ("PIL"), which acts as an interconnect between GPIO ports 1007 and a digital block array of the processing device 1010 (not shown). The digital block array may be configurable to implement a variety of digital logic circuits (e.g., DACs, digital filters, or digital control systems) using, in one embodiment, configurable user modules ("UMs"). The digital block array may be coupled to a system bus. Processing device 1010 may also include memory, such as random access memory ("RAM") 1005 and program flash 1004. RAM 1005 may be static RAM ("SRAM"), and program flash 1004 may be a non-volatile storage, which may be used to store firmware (e.g., control algorithms executable by processing core 1002 to implement operations described herein). Processing device 1010 may also include a memory controller unit ("MCU") 1003 coupled to memory and the processing core 1002. The processing core 1002 is a processing element configured to execute instructions or perform operations. The processing device 1010 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 1002. In the case of the memory being external to the processing device, the processing device is coupled to the other device in which the memory resides as would be appreciated by one of ordinary skill in the art having the benefit of this disclosure.

The processing device 1010 may also include an analog block array (not shown). The analog block array is also coupled to the system bus. Analog block array may also be configurable to implement a variety of analog circuits (e.g., ADCs or analog filters) using, in one embodiment, configurable UMs. The analog block array may also be coupled to the GPIO 1007.

As illustrated, capacitance-sensing circuit 1001 may be integrated into processing device 1010. Capacitance-sensing circuit 1001 may include analog I/O for coupling to an external component, such as touch-sensor pad (not shown), capacitive sense array 1025, touch-sensor slider (not shown), touch-sensor buttons (not shown), and/or other devices. The capacitance-sensing circuit 1001 may be configurable to measure capacitance using mutual-capacitance sensing techniques, self-capacitance sensing technique, charge coupling techniques or the like. In one embodiment, capacitance-sensing circuit 1001 operates using a charge accumulation circuit, a capacitance modulation circuit, or other capacitance sensing methods known by those skilled in the art. In an embodiment, the capacitance-sensing circuit 1001 is of the Cypress TMA-3xx, TMA-4xx, or TMA-xx families of touch screen controllers. Alternatively, other capacitance-sensing circuits may be used. The mutual capacitive sense arrays, or touch screens, as described herein, may include a transparent, conductive sense array disposed on, in, or under either a visual display itself (e.g. LCD monitor), or a transparent substrate in front of the display. In an embodiment, the TX and RX electrodes are configured in rows and columns, respectively. It should be noted that the rows and columns of electrodes can be configured as TX or RX electrodes by the capacitance-sensing circuit 1001 in any chosen combination. In one embodiment, the TX and RX electrodes of the sense array 1025 are configurable to operate as a TX and RX electrodes of a mutual capacitive sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive sense array, instead of measuring a mutual capacitance at an intersection of a RX electrode and a TX electrode (a sense element) as done during mutual-capacitance sensing. An intersection between two sense elements may be understood as a location at which one sense electrode crosses over or overlaps another, while maintaining galvanic isolation from each other. The capacitance-sensing circuit 1001 does not use mutual-capacitance or self-capacitance sensing to measure capacitances of the sense elements when performing a stylus sensing. Rather, the capacitance-sensing circuit 1001 measures a charge that is capacitively coupled between the sense array 1025 and the stylus as described herein. The capacitance associated with the intersection between a TX electrode and an RX electrode can be sensed by selecting every available combination of TX electrode and RX electrode. When a touch object, such as a finger or stylus, approaches the capacitive sense array 1025, the object causes a decrease in mutual capacitance between some of the TX/RX electrodes. In another embodiment, the presence of a finger increases the coupling capacitance of the electrodes. Thus, the location of the finger on the capacitive sense array 1025 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

The capacitance-sensing circuit 1001 includes the adaptive resolution circuit 1020. Additional details of the adaptive resolution circuit 1020 are described above with respect to FIGS. 2-8.

In an embodiment, the electronic system 1000 may also include non-capacitive sense elements 1070 coupled to the processing device 1010 via bus 1071 and GPIO port 1007. The non-capacitive sense elements 1070 may include buttons, light emitting diodes ("LEDs"), and other user interface devices, such as a mouse, a keyboard, or other functional keys that do not use capacitance sensing. In one embodiment, buses 1022, and 1071 are embodied in a single bus. Alternatively, these buses may be configured into any combination of one or more separate buses.

Processing device 1010 may include internal oscillator/clocks 1006 and communication block ("COM") 1008. In another embodiment, the processing device 1010 includes a spread spectrum clock (not shown). The oscillator/clocks block 1006 provides clock signals to one or more of the components of processing device 1010. Communication block 1008 may be used to communicate with an external component, such as a host processor 1050, via host interface ("I/F") line 1051. Alternatively, processing device 1010 may also be coupled to embedded controller 1060 to communicate with the external components, such as host processor 1050. In one embodiment, the processing device 1010 is configurable to communicate with the embedded controller 1060 or the host processor 1050 to send and/or receive data.

Processing device 1010 may reside on a common carrier substrate such as, for example, an integrated circuit ("IC") die substrate, a multi-chip module substrate, or the like. Alternatively, the components of processing device 1010 may be one or more separate integrated circuits and/or discrete components. In one exemplary embodiment, processing device 1010 is the Programmable System on a Chip (PSoC®) processing device, developed by Cypress Semiconductor Corporation, San Jose, Calif. Alternatively, processing device 1010 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect, the processing that is done by processing device 1010 may be done in the host.

Capacitance-sensing circuit 1001 may be integrated into the IC of the processing device 1010, or alternatively, in a separate IC. Alternatively, descriptions of capacitance-sensing circuit 1001 may be generated and compiled for incorporation into other integrated circuits. For example, behavioral level code describing the capacitance-sensing circuit 1001, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 1001.

It should be noted that the components of electronic system 1000 may include all the components described above. Alternatively, electronic system 1000 may include some of the components described above.

In one embodiment, the electronic system 1000 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The embodiments described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one embodiment, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising:
an input node coupled to a capacitance sense pin coupled to an electrode of a sense array;
a capacitance-sensing circuit coupled to the input node, wherein the capacitance-sensing circuit comprises:
a signal generator coupled to a second capacitance sense pin coupled to a second electrode of the sense array;
an integrator configured to measure a first mutual capacitance of an intersection between the electrode and the second electrode with a first resolution;
a first integrator capacitor coupled between the input node and an output of the integrator; and
an adaptive resolution circuit coupled to the capacitance-sensing circuit and the input node, wherein the adaptive resolution circuit is configured to selectively modify an integration parameter to set the integrator to measure a second mutual capacitance of the intersection with a second resolution, wherein the integration parameter is an integration capacitance of the integrator, and wherein the adaptive resolution circuit comprises:
a second capacitor;
a comparator coupled to the output of the integrator; and
a switch coupled to an output of the comparator, wherein the comparator is to selectively switch the second capacitor in parallel to the first integrator capacitor of the capacitance-sensing circuit to modify the integration capacitance of the integrator for the second resolution.

2. The apparatus of claim 1, wherein the capacitance-sensing circuit comprises an analog-to-digital converter (ADC) coupled to the output of the integrator to convert the output of the integrator to a digital value.

3. A method comprising:
driving a transmit (TX) signal on a first capacitance sense pin coupled to a first electrode of a sense array;
receiving at an input node of a capacitance-sensing circuit a receive (RX) signal on a second capacitance sense pin coupled to a second electrode of the sense array;
integrating the RX signal by an integrator comprising a first integrator capacitor with a first resolution of the capacitance-sensing circuit, wherein the first integrator capacitor is coupled between the input node and an output of the integrator, wherein the integrated RX signal with the first resolution represents a first mutual capacitance between the first electrode and the second electrode;
selectively coupling a second capacitor in parallel to the first integrator capacitor to modify the integrator to integrate with a second resolution of the capacitance-sensing circuit, wherein the selectively coupling comprises:
comparing the output of the integrator with a comparator; and
selectively coupling the second capacitor in parallel to the integrator capacitor via a switch to modify the integration capacitance for the second resolution based on an output of the comparator; and
integrating the RX signal by the integrator with the second resolution, wherein the integrated RX signal with the second resolution represents a second mutual capacitance between the first electrode and the second electrode.

4. The method of claim 3, further comprising converting the output of the integrator to a digital value by an analog-to-digital converter (ADC) coupled to the output of the integrator.

5. A system comprising:
a sense array comprising a plurality of electrodes; and
a processing device coupled to the sense array via capacitance sense pins, wherein the processing device comprises:
an input node coupled to a first pin of the capacitance sense pins;
a signal generator coupled to a second pin of the capacitance sense pins;
an integrator coupled to the input node and to measure a mutual capacitance of an intersection between a pair of electrodes of the sense array, the pair being coupled to the first pin and the second pin;
a first integrator capacitor coupled between the input node and an output of the integrator; and
an adaptive resolution circuit coupled to the input node and the output of the integrator, wherein the adaptive resolution circuit comprises:
a second integrator capacitor;
a comparator coupled to the output of the integrator; and
a switch coupled to an output of the comparator, wherein the comparator is to selectively switch the second integrator capacitor in parallel to the first integrator capacitor of the, wherein the integrator is to measure the mutual capacitance with a first resolution when the second integrator capacitor is not switched in parallel to the first integrator capacitor and to measure the mutual capacitance with a second resolution when the integrator capacitor is switched in parallel to the first integrator capacitor.

6. The system of claim 5, wherein the processing device comprises a multiplexer bus coupled to the input node of the integrator, wherein the multiplexer is to selectively couple the input node to one of the capacitance sense pins.

7. The system of claim 5, wherein the processing device further comprises an analog-to-digital converter (ADC) coupled to the output of the integrator to convert the output of the integrator to a digital value.

\* \* \* \* \*